United States Patent
Ippolito et al.

(10) Patent No.: US 9,310,429 B2
(45) Date of Patent: Apr. 12, 2016

(54) METHOD AND APPARATUS FOR PROBING A WAFER

(75) Inventors: Stephen Bradley Ippolito, Yorktown Heights, NY (US); Alan J. Weger, Yorktown Heights, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 983 days.

(21) Appl. No.: 13/462,964

(22) Filed: May 3, 2012

(65) Prior Publication Data

US 2012/0217974 A1 Aug. 30, 2012

Related U.S. Application Data

(62) Division of application No. 12/417,454, filed on Apr. 2, 2009, now Pat. No. 8,248,097.

(51) Int. Cl.
*G01R 31/00* (2006.01)
*G01R 31/311* (2006.01)

(52) U.S. Cl.
CPC ................................ *G01R 31/311* (2013.01)

(58) Field of Classification Search
None
See application file for complete search history.

(56) References Cited

U.S. PATENT DOCUMENTS

| | | | | |
|---|---|---|---|---|
| 6,002,426 A * | 12/1999 | Back | ...................... | H04N 7/181 324/750.23 |
| 6,621,275 B2 * | 9/2003 | Cotton | .................. | G01R 31/311 324/537 |
| 6,710,798 B1 * | 3/2004 | Hershel | .............. | G01R 31/2887 324/750.23 |
| 7,123,035 B2 * | 10/2006 | Hanson | ................ | G01R 31/311 324/750.23 |
| 2003/0039865 A1 * | 2/2003 | Kelsey | ...................... | C03C 3/06 428/696 |

* cited by examiner

*Primary Examiner* — Paresh Patel
(74) *Attorney, Agent, or Firm* — Robert Curcio; DeLio, Peterson & Curcio, LLC

(57) ABSTRACT

A semiconductor wafer resting on a contact element has a spatially distributed force applied to its frontside and an equal and opposing force applied to its backside. The contact element comprises a solid immersion lens (SIL), and has an area less than the area of the wafer, but no less than the larger of the area of an optical collection area and an electrical probe assembly. The equal and opposing forces cause the wafer to conform to the shape of the contact element. Measurements, including electrical testing, optical probing and wafer characterization are performed on the wafer.

9 Claims, 7 Drawing Sheets

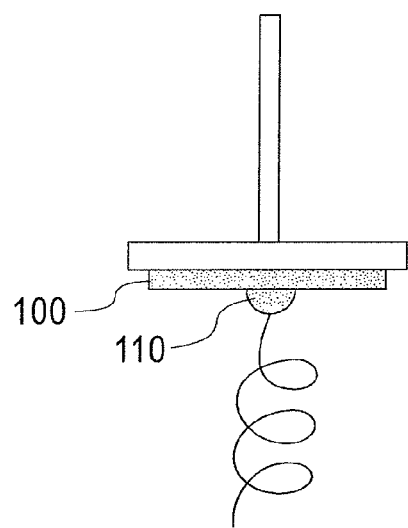
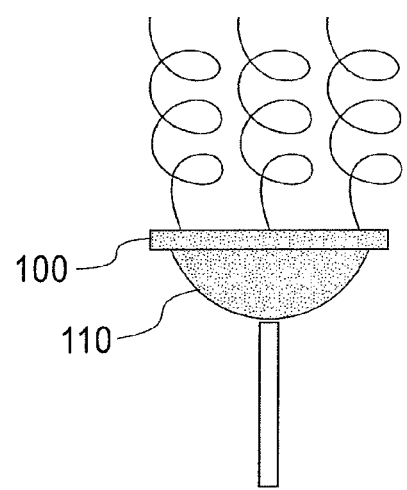
FIG. 6A
Prior Art
FIG. 6B

METHOD AND APPARATUS FOR PROBING A WAFER

CROSS-REFERENCE TO RELATED APPLICATIONS

This application is a Divisional Application of U.S. application Ser. No. 12/417,454, filed on Apr. 2, 2009, the disclosure of which is incorporated by reference herein in its entirety.

BACKGROUND

1. Technical Field

The present invention relates to integrated circuit test and characterization, and more particularly to a method and apparatus for probing a wafer.

2. Discussion of Related Art

Test and analysis of integrated circuits at wafer level may use different degrees of electrical, mechanical, thermal and optical stimulus and response, depending on the application. Electrical powering and communication with the device under test (e.g., a chip(s) disposed of the wafer) is usually provided by a tester and power supplies through an electrical prober with a probe card or separate probes applied to the frontside of the wafer on which the transistors and interconnects have been fabricated. The electrical probing force on the frontside of the wafer is typically countered by force on the backside of the wafer from a contact element.

In the current state of the art, the contact element is typically a metallic disc or wafer chuck that is approximately the same diameter as the wafer to be tested. The purpose of the chuck is to hold the wafer in place for probing, provide sufficient mechanical stability so as to prevent undesired motion of the device under test when electrical contacts and their associated forces are engaged, and to provide a thermal environment for the device under test (e.g., cooling). The wafer is placed with the substrate (or backside) facing the chuck, and the circuit side (or frontside) of the wafer is presented to an electrical probing system to permit power and input-output (I/O) signals to be connected to the device under test. The force applied to the frontside of the wafer can be as much as 250 lbs. per square inch, or more. Heat dissipation and non-ambient temperature testing may be implemented using the chuck or contact element to control the device temperature. From the thermal point of view, a large wafer-sized chuck may contain nonuniform thermal contact or coolant flow across the wafer, leading to hot spots.

The nominal thickness of a semiconductor wafer is around 0.775 mm, however, in some applications the wafer can be thinned to as little as 0.010 mm (10 microns). Although these thin wafers are typically attached to a thicker handler wafer, they can be extremely fragile, and internal stress can lead to fractures and device failure. If the wafer is laterally fixed (e.g., by applying a vacuum to one side) during the application of a force such as electrical probing, internal stress may be generated at points at which a gap exists between the chuck and wafer, or by relative thermal expansion between the wafer and the chuck.

For circuit testing and analysis, optical interaction with the circuits is often required. Opaque interconnect metallization limits and often prevents frontside microscopy of the transistors, and as a result, backside microscopy through the wafer is usually required. For this reason, transparent contact elements, such as a glass plate larger than the wafer, are commercially available to allow optical interaction with the circuits. However, contact elements like the glass plate are applicable only in low force and low power dissipation applications, and are thus not suitable for testing modern microprocessors. Furthermore, current high force and high power chucks, which are suitable for testing modern microprocessors, are opaque to light transmission, thus preventing optical interaction.

Many circuit testing and analysis applications require the resolving and light-gathering power of subsurface solid immersion microscopy, which is also termed numerical aperture increasing lens microscopy. In subsurface solid immersion microscopy of circuits through the wafer, photons must tunnel across the gap that exists in practice between the lens and wafer due to mechanical mismatch, thus intimate contact is necessary. Currently available solid immersion lenses (SIL) are applied by a spring-loaded mechanism to the device under test, which must be rigidly mounted in order to avoid surface damage. A SIL typically has either a convex surface or a raised surface which makes contact with the wafer only over a very small area, which is insufficient to provide a counter-force for electrical probing. In the prior art of SIL microscopy, the chip or module as well as the SIL are considered to be rigid or inelastic. Furthermore, because chips mounted on modules generally cannot be made optically flat over a substantial area, it is typically viewed as both unnecessary and undesirable for a SIL to have a large surface area. As a result, the SIL is typically small, having a diameter of only a few millimeters. Because of the size of the SIL, the optical field of view (FOV) is small (e.g., 0.05 mm in diameter) and the SIL cannot provide a counter-force on the chip or module.

Optical probing of integrated circuits is mainly done after the wafer is diced into chips and placed on modular packages (modules). However, not all devices (e.g. kerf structures) are packaged, and are thus unavailable to optical probing at the module level. In addition, in order to package an IC chip, surface preparations and other processing steps are often required which interfere with the optical properties of the chip, and certain ideal properties of a silicon wafer (e.g. flatness) are lost upon mounting in the module. As a result, it is desirable to optically probe silicon wafers prior to packaging, and to do this optical probing in conjunction with wafer electrical testing, which minimizes overall test time.

For the foregoing reasons, there is a need for an apparatus for probing wafers of varying thickness that allows electrical, mechanical, thermal and optical control while also reducing or eliminating the likelihood of causing damage to the wafer.

BRIEF SUMMARY

According to an embodiment of the present disclosure, a method for probing a wafer or a portion of the wafer comprises rigidly mounting a solid immersion lens (SIL). The wafer is then positioned so that an area on a first side of the wafer is substantially centered with respect to a surface of the SIL. The wafer is then brought into close proximity with the SIL. Contact is established between the wafer and the SIL by applying a first spatially distributed force on a second side of the wafer, opposite the first side of the wafer, and applying a second force on the first side of the wafer, wherein the second force is substantially equal and opposite the first force. Optical probing is performed within an area of the wafer corresponding to the SIL.

According to an embodiment of the present disclosure, an apparatus for probing a wafer or a portion of the wafer comprises a SIL having a surface supporting the first side of the wafer, a supporting structure rigidly mounting the SIL in place, an electrical probe assembly above a second side of the wafer, opposite the first side of the wafer, and a wafer positioning system for positioning the wafer.

According to an embodiment of the present disclosure, a solid immersion lens (SIL) for probing a wafer or a portion of the wafer comprises a surface for supporting a first side of the wafer. The area of the surface of the SIL is no less than the larger of the area of an optical collection area and an electrical probe assembly.

According to an embodiment of the present disclosure, an optical flat for probing a wafer or a portion of the wafer comprises a surface for supporting a first side of the wafer. The area of the surface of the optical flat is less than the area of the wafer, and is no less than the larger of the area of an optical collection area and an electrical probe assembly, and the surface is substantially flat.

BRIEF DESCRIPTION OF THE SEVERAL VIEWS OF THE DRAWINGS

Preferred embodiments of the present disclosure will be described below in more detail, with reference to the accompanying drawings:

FIG. 6A illustrates solid immersion microscopy of the prior art.

FIG. 6B illustrates an example of solid immersion microscopy generalized to the problem of wafer probing.

DETAILED DESCRIPTION

According to an embodiment of the present disclosure, a method for probing semiconductor wafers of varying thickness that allows electrical, mechanical, thermal and optical stimulus and response, while reducing or eliminating the likelihood of causing damage to the wafer. According to an embodiment of the present disclosure, a backside optical capability is enabled for simultaneous application in an in-line wafer testing during electrical testing.

According to an embodiment of the present disclosure, an apparatus for probing a semiconductor wafer comprises a contact element 103, a plate or supporting structure 104 and an electrical probe assembly 105.

Figure 3:
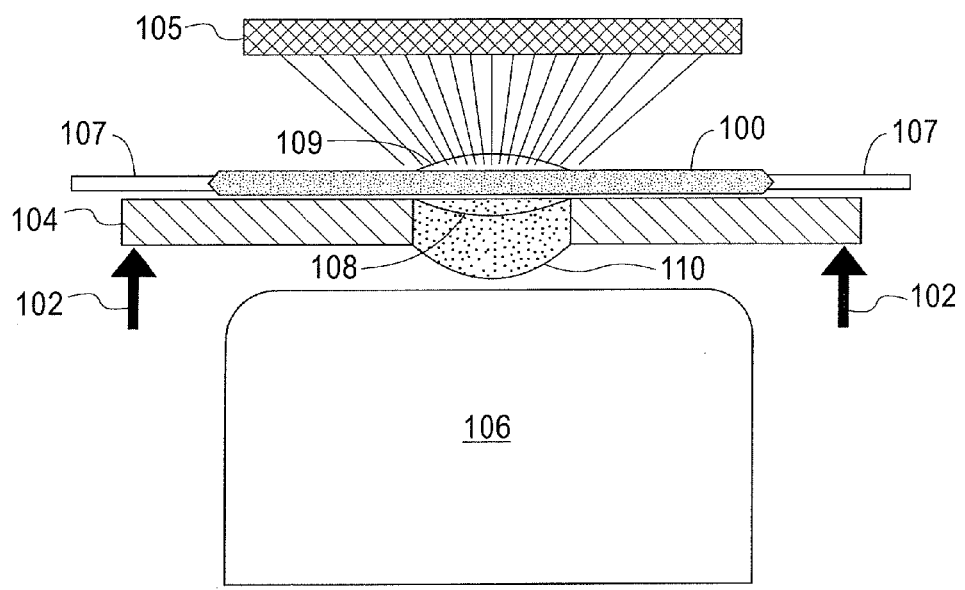
FIG. 3 is a side view of an apparatus including a probe card and SIL according to an embodiment of the present disclosure.

The contact element 103 is supported by a supporting structure 104. The contact element 103 comprises a solid immersion lens (SIL) 110, but other structures, such as an optical flat or plano-convex lens, may also be used. The SIL 110 is rigidly mounted in place and a spatially distributed force 101 is provided by the electrical probe assembly 105 on an opposite side of the wafer 100 from the SIL 110. The SIL 110 presents an equal and opposing counterforce 102 against the spatially distributed force 101, in much the same way as the two opposing sides of a mechanical set of pliers; a combination of the electrical probe assembly 105 and the SIL 110 is referred to as wafer pliers herein. The supporting structure 104 supporting the contact element 103 must not interfere with the establishment of intimate contact between the contact element 103 and the wafer 100 and must rigidly hold the contact element 103 in place both prior to and during the application of forces to the wafer 100. In preferred embodiments, a wafer supporting structure 107 may be implemented, wherein the wafer supporting structure 107 is a positioning system capable of clamping, holding or supporting the wafer 100 to permit automatic wafer loading and unloading (e.g., the wafer supporting structure 107 may move along the x, y and z axes). In FIG. 3 the positioning system includes a clamping apparatus that holds the wafer 100 by its beveled edges; this apparatus may be movable to permit the clamps to grasp edges of the wafer 100.

The wafer 100 is moved by a positioning system that centers the device under test on the SIL 110. The size of the SIL 110 primarily relates to the size of the optical collection area 108, which may be as large as 600 mm² (20 mm×30 mm). The size of the SIL 110 is also a result of other constraints in the optical system (e.g., the working distance of the optical microscope 106). Typically, the SIL 110 will not be as large as the area of the wafer 100, but will rather be substantially the size of the larger of the optical collection area 108 and the electrical probe assembly 105. In a preferred embodiment of the present invention, the SIL can be made arbitrarily large (e.g., 20 mm in diameter), resulting in an increased field of view (FOV) and lower relative fabrication costs. If the optical collection area 108 is large, a flat silicon slab, or an optical flat, may be used instead of a SIL 110. Due to the limited size of the SIL 110 and the extreme flatness of the wafer 100, there is near conformity between the SIL 110 and the wafer 100 prior to the application of the spatially distributed force 101, which decreases the amount of force later required to obtain full conformity between the SIL 110 and the wafer 100. The degree of intimate contact between the SIL 110 and the wafer 100 may be in the nanometer regime. The high level of conformity between the SIL 110 and the wafer 100 and the limited size of the SIL 110 help reduce the number of gaps between the SIL 110 and the wafer 100, which decreases the likelihood of lateral stresses damaging the wafer 100 during the probing process. By limiting the contact area with the wafer 100 to that required for probing by maximizing the flatness of the contact area, and by choosing a material for the SIL 110 whose coefficient of thermal expansion matches that of the wafer 100 (e.g., silicon), the probability of catastrophic mechanical failure of circuit elements fabricated on the wafer 100 is reduced.

While positioning the wafer 100, contact with the SIL 110 as well as the electrical probe assembly 105 is avoided, e.g., to prevent scratching or other damage. While positioning, the wafer 100 is in the middle of the pliers, but there is no contact on either side. A working distance or gap between the pliers is on the order of a few millimeters (mm). The contact element 103 is rigid or fixed prior to the application of probing force and the wafer is un-moved when the force is applied. Therefore, the wafer 100 may be either in minimal contact with the contact element 103 (e.g. resting on it, or lightly attached by a vacuum in the inverted configuration) or in close proximity to it—otherwise, when the probe force is applied, and the wafer is clamped in the positioning system, the wafer 100 may deform in some undesirable way. Similarly, if the contact element 103 were pushed beyond minimal contact with the wafer 100 while the wafer 100 was held in place, then the wafer might deform, and intimate contact could be lost. Thus, close proximity is the distance or force at which no deformation is caused in the wafer 100. Furthermore, deformation is substantially prevented if the wafer 100 is unclamped from the positioning system. The equal and opposite forces maintain intimate contact, and it is preferable to start with the wafer 100 close to or on the contact element since both of those are substantially flat. It may be possible in some cases to start with the wafer 100 in close proximity to the electrical probe assembly 105 and then apply the force to the contact element.

The SIL 110 may permit intimate optical contact with the wafer 100 (e.g., solid immersion) to provide optimum optical performance during optical probing. The backside wafer surface will conform to the entire surface of the SIL 110 under the spatially distributed force 101 provided by the electrical probe assembly 105 and an additional force, if necessary. The SIL 110 is suitable for the testing of modern microprocessors, which requires high force and high power applications. Optical excitation, emission and scattering microscopy, including laser stimulation microscopy, time resolved hot electron emission microscopy, static hot electron emission microscopy and thermal imaging microscopy, may be utilized to perform optical probing on the wafer 100, and the SIL 110 may permit probing at 1064 nm (nanometers) and 1340 nm, as well as in the near infrared spectrum (e.g., 900 nm-1800 nm).

Optical probing as described herein may be performed using various technologies. For example, an optical circuit (not shown) for probing may include, but is not limited to, a light source, detector and/or waveguide. The optical circuit implements an evanescent coupling mechanism to provide optical sensing of the environment including a wafer or a portion of the wafer. The evanescent coupling mechanism may provide optical sensing in real time for a range of sensing applications, including measurements of temperature, pressure, presence of selected materials, emission detection from a wafer, etc.

In an embodiment of the present disclosure, the contact element 103 can be utilized as both an optical element and a cooling or heat dissipating element. The contact element 103 and the electrical probe assembly 105 can be fitted with a heating or cooling apparatus to permit the device under test to achieve a desired temperature, or for power in the form of heat to be removed from the devices under test during their operation. The heating or cooling apparatus may be contained within or attached to the supporting structure 104. Possible methods of cooling the wafer 100 include heat conduction to the supporting structure 104 (which may itself be cooled, e.g., by water channels), cooling the SIL 110 by jet impingement of water, and utilizing a cooling apparatus attached to the supporting structure 104 to directly cool a portion of the wafer 100. The SIL 110 can be made of silicon to match the refractive index of a silicon wafer and provide good thermal conductivity. Because of the limited size of the SIL 110, the likelihood of nonuniform coolant flow across the wafer 100, which can lead to hot spots on the wafer 100, is reduced.

Figure 1:
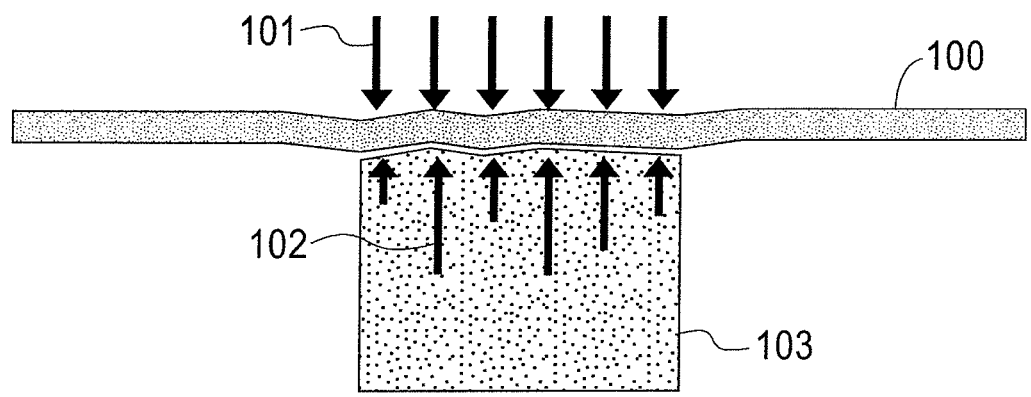
FIG. 1 is an exaggerated side view illustrating the lack of relative flatness of a contact element and a wafer according to an embodiment of the present disclosure.

FIG. 1 is an exaggerated view illustrating the lack of relative flatness of both the contact element 103 and the wafer 100. In order to establish a high degree of intimate contact between the contact element 103 and the wafer 100, a spatially distributed force 101 is applied to the frontside of the wafer 100 and an equal and opposing counterforce 102 is applied to the backside of the wafer 100. The wafer 100 is treated as an elastic body, whose shape is deformed according to the surface of the contact element 103. The spatially distributed force 101 and the equal and opposing counterforce 102, along with the uneven surface of the contact element 103, convey an operational improvement over the prior art in the establishment of a high level of surface conformity between the contact element 103 and the wafer 100.

Figure 2:
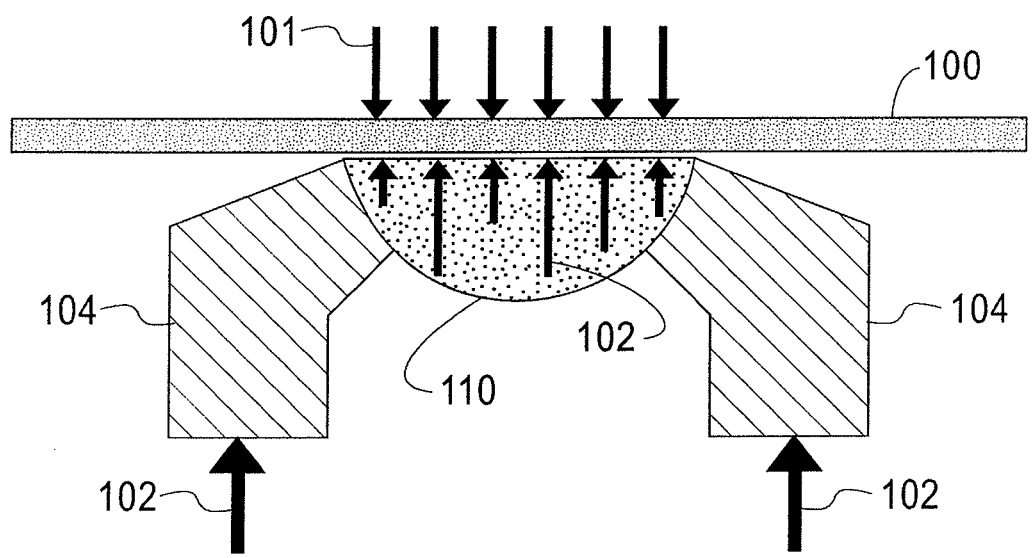
FIG. 2 is a side view of an apparatus according to an embodiment of the present disclosure.

An embodiment of the present disclosure is shown in FIG. 2. The SIL 110 is rigidly mounted in place by a supporting structure 104. As a result of the limited size of the SIL 110, there is near conformity between the SIL 110 and the wafer 100 prior to the application of the spatially distributed force 101 on the frontside of the wafer 100, which reduces the amount of force required to obtain full conformity between the SIL 110 and the wafer 100. The spatially distributed force 101 applied to the frontside of the wafer 100 and the equal and opposing counterforce 102 applied to the backside of the wafer 100 cause intimate contact to be established between the SIL 110 and the wafer 100. If the spatially distributed force 101 applied to the frontside of the wafer 100 is not large enough to cause conformity between the SIL 110 and the wafer 100, the spatially distributed force 101 may be supplemented with an additional mechanical force or with a fluidic pressure. The high level of conformity between the wafer 100 and the SIL 110 reduces the likelihood of the wafer 100 being damaged during the probing process.

An embodiment of the present disclosure is shown in FIG. 3. In this embodiment, the optical collection area 108 and the electrical probing area 109 are equal to the size of the SIL 110. The SIL 110 is oriented with the planar side up and is mounted in a plate 104, which is mounted above an optical microscope 106 whose optical system is inverted. The wafer 100, which was double-sided polished at the outset of processing, is placed on a teflon ring whose inside diameter is large enough to permit the wafer 100 to make good contact with the SIL 110. A positioning system is provided to allow the position of the wafer 100 to be adjusted so that the area or device being tested on the wafer 100 is directly above the center of the SIL 110 without establishing contact between the SIL 110 and the wafer 100. The positioning system positions the wafer 100 independently of the SIL 110. The SIL 110 is then raised to establish contact with the wafer 100, which decreases wafer displacement and promotes conformity between the SIL 110 and the wafer 100. Alternatively, the wafer 100 may be lowered to establish contact with the SIL 110. An electrical probe assembly 105 is placed in position so that the probes align with the electrical pads on the frontside of the wafer 100, and the electrical probe assembly 105 is then lowered into place. The spatially distributed force 101 and an additional force (e.g., a spring force or the force of gravity), if necessary, cause the wafer 100 to conform to the entire optical surface of the SIL 110. The device under test is then electrically powered and stimulated while the optical measurement is made and an optical stimulus is applied.

Figure 4:
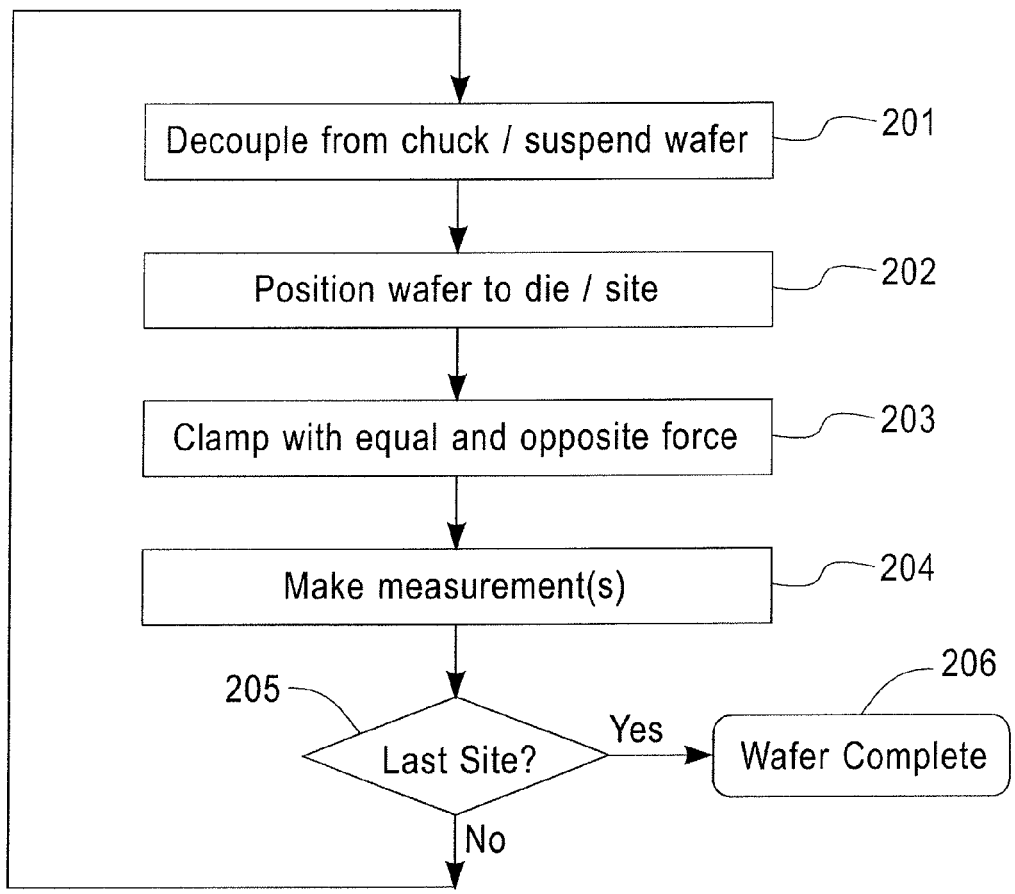
FIG. 4 is a flow diagram of the wafer probing process according to an embodiment of the present disclosure.

FIG. 4 is a flow diagram showing the process of probing a wafer 100. The wafer 100 is first decoupled from the chuck or contact element 103 at block 201. The wafer 100 is then positioned so that the device to be tested on the wafer 100 is centered over the contact element 103 at block 202. The wafer 100 is then clamped with equal and opposite forces applied to the frontside and backside of the wafer 100 at block 203. Measurements, including electrical testing and optical probing, are then made at block 204. At block 205, it is determined whether probing of the wafer 100 is complete. If there are devices remaining on the wafer 100 that still require probing, steps 201 through 205 are repeated. Once all devices requiring testing on the wafer 100 have been probed, the probing process ends at block 206.

Figure 5:
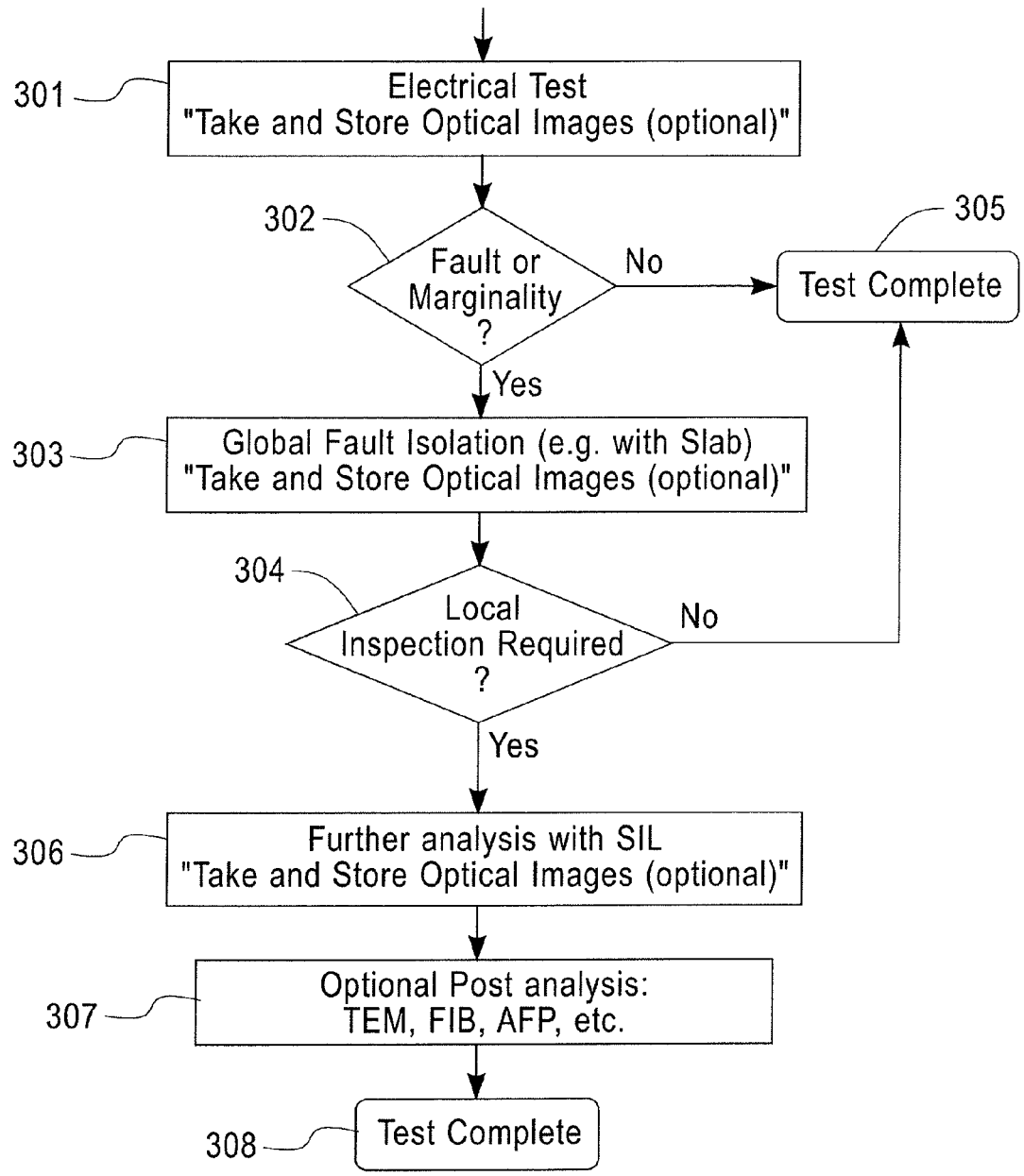
FIG. 5 is a flow diagram of measurements taken during a probing process according to an embodiment of the present disclosure.

FIG. 5 is a flow diagram showing the measurements made during analysis of a wafer. The device under test is electrically tested at block 301. At block 302, the device under test (e.g., a chip) is checked for faults. If no faults are detected, measurements end at block 306. If a fault is detected, global fault isolation is performed at block 303. Global fault isolation allows any part of the wafer, for example, a single chip, to be optically probed. Since an optical flat (e.g., a slab of silicon), unlike a SIL 110, has a field of view (FOV) that encompasses the entire chip, an optical flat may be preferred for global fault isolation. However, because of the limited spatial resolution of the optical flat, the SIL 110 may be used when precisely localized regions of the wafer must be examined under great detail. As a result, it may be desirable to have both an optical flat and a SIL 110 available for use in the same system. Alternatively, wafers first tested on an optical slab may be sent to a second system containing a SIL 110, or the optical slab and the SIL 110 may be interchangeable on the same system (see FIGS. 3 and 8), either manually or automatically. Optical images may be acquired and stored for later analysis. Here, an optical flat having a large FOV (e.g., about 25 mm) may be used in place of a SIL 110 at this step. At block 304, it is determined whether local inspection is required. If no local inspection is required, measurements end at block 305. If local inspection is required, the device under test is optically probed at block 306. Optional post analysis is performed at block 307, and the measurements end at block 308.

FIG. 6A shows a method of solid immersion microscopy in which the wafer 100 is rigidly mounted and the SIL 110, which is spring mounted, is moved into contact with the wafer 100 during testing. Conventional SILs, such as the SIL 110 shown in FIG. 6A, have a diameter of about 2 millimeters. Further, conventional SILs often have either a convex surface or a raised surface in the center, either of which makes contact with the chip surface over a very small area.

FIG. 6B shows an embodiment of the present disclosure, wherein the SIL 110 is rigidly mounted and the wafer 100 is moved into contact with the SIL 110 as a result of a spatially distributed force 101 applied to the frontside of the wafer 100. The SIL 110 surface is forced into conformity with the wafer over a large area; the SIL 110 has a typical diameter of about 20 millimeters, more or less as required. The spatially distributed force, and the SIL having a large size, unexpectedly cause increased surface conformity to be achieved between the wafer 100 and the SIL 110 with respect to SIL embodiments in the prior art. Typically, the area of extremely intimate optical contact (in the nm regime) required between the wafer and the SIL is confined to a small area in the center (e.g., less than 1 mm in diameter), but in embodiments of the present invention, this area is generally larger than in prior-art embodiments of a SIL. Increasing the size of the SIL beyond several millimeters improves the field of view (FOV); for example, the distortion-free FOV of the SIL increases as the square root of the diameter of the SIL increases. Increasing the area of extreme intimate contact beyond about 1 mm diameter does not necessarily improve the optical performance, but may improve thermal conductivity as well as mechanical properties (e.g., uniform distribution of forces or reduced stress). The degree of flatness and intimate contact required are reduced outside of the approximately 1 mm diameter needed for optical contact. According to an embodiment of the present disclosure, the SIL is rigidly fixed in place; a small initial force is applied to the wafer (such as a probe card) and the initial force is balanced with increasing primary and restoring forces as in wafer pliers, until the ultimate force needed for electrical probing is achieved. If a high-force probe card (or other large counter-force) is used, the SIL or contact element, or an adjoining structure or means capable of providing sufficient restoring force, must extend over an area at least as large as that of that portion of the probe card which supplies force to the wafer, otherwise the unbalanced force of the probe card will cause the wafer surface to bend, and intimate contact with the center of the SIL or contact element may be lost.

Figure 7:
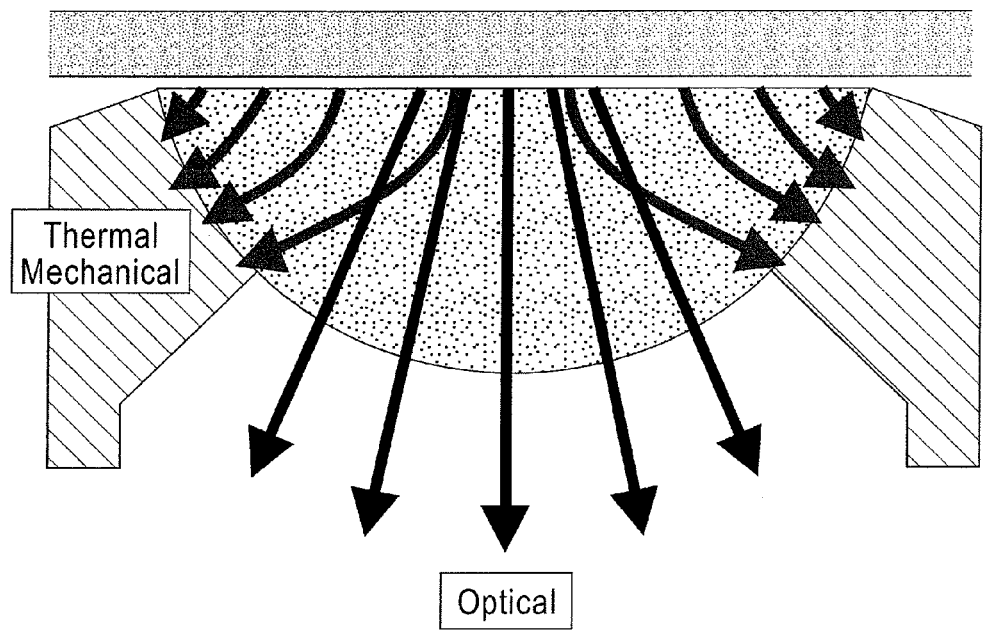
FIG. 7 is a side view illustrating the degree of intimate contact required for different purposes between a contact element and a wafer according to an embodiment of the present invention.

FIG. 7 illustrates the relative zones of influence and sizes of the area of intimate contact required for different purposes. For instance, the optical contact zone 111 is most demanding in terms of intimate contact, but is only critical in the center of the SIL 110. The thermal/mechanical contact zone 112 requires some degree of intimate contact to promote heat conduction and restoring forces for electrical probing, respectively. Additionally, only the optical contact zone 111 requires optical transparency; the thermal/mechanical zone 112 may correspond with opaque materials (e.g., a supporting structure 104).

Figure 8:
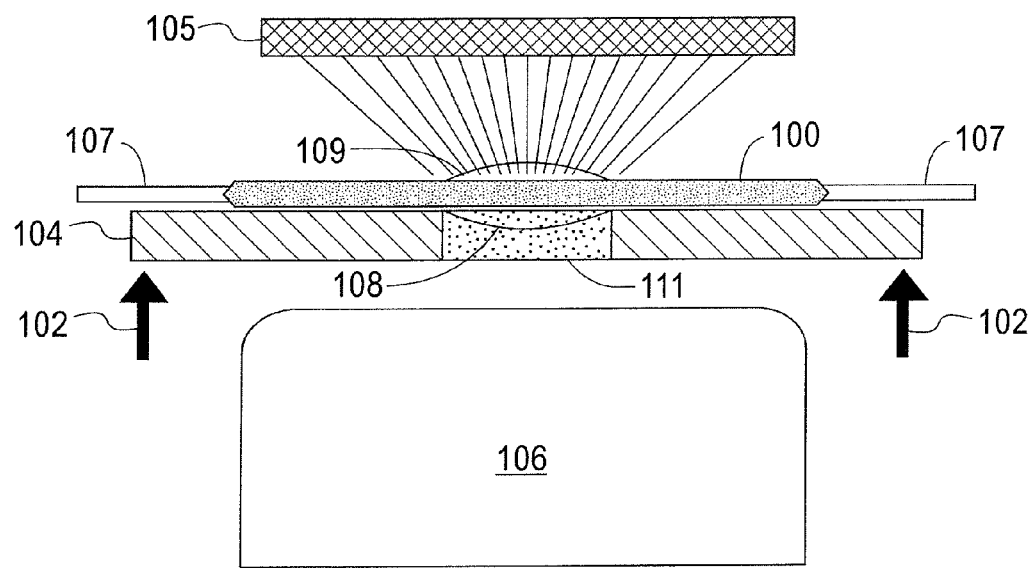
FIG. 8 is a side view of an apparatus including a probe card and slab according to an embodiment of the present disclosure.

In FIG. 8, the SIL of FIG. 3 is replaced by a slab 111. The slab may be continuous or have one or more holes. For example, in some applications a fiber optic probe or a small lens may be inserted into or through the slab 111.

Figure 9:
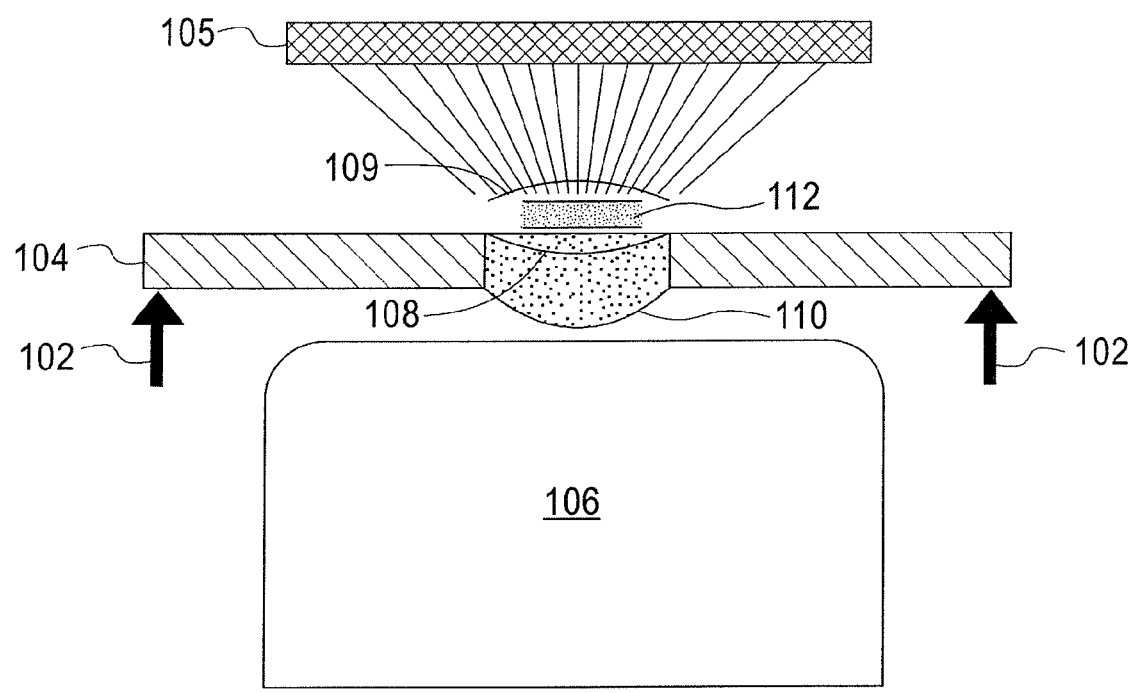
FIG. 9 is a side view of an apparatus including a probe card and SIL and a wafer piece or ship according to an embodiment of the present disclosure.

FIG. 9 shows a wafer 112, or a piece of a wafer, where the SIL is larger than the wafer) 112. Here, the SIL 110 is held rigidly in place. The wafer 112 is set upon a SIL 110, which has one flat side. A force is provided by the electrical probe assembly 105, which is sufficient to give intimate contact. This configuration also works in the inverted sense, e.g. flipped over with the flat part of the SIL 110 facing down.

Having described embodiments for an apparatus for probing a wafer, it is noted that modifications and variations can be made by persons skilled in the art in light of the above teachings. It is therefore to be understood that changes may be made in embodiments of the invention disclosed which are within the scope and spirit of the invention as defined by the appended claims. Having thus described the invention with the details and particularity required by the patent laws, what is claimed and desired protected by Letters Patent is set forth in the appended claims.

What is claimed is:

1. An apparatus for probing a wafer or a portion of the wafer, comprising:
   a solid immersion lens (SIL) having a surface supporting a first side of the wafer and providing a first force to said first side of said wafer;
   a supporting structure rigidly fixing the SIL in place;
   an electrical probe assembly above a second side of the wafer, opposite the first side of the wafer, and providing a second force to said second side of said wafer, said second force counter to said first force, wherein said first force and said second force form a wafer pliers against said wafer, such that forces are balanced with increasing primary and restoring forces by said wafer pliers, until an ultimate force needed for electrical probing is achieved without the bending said wafer; and
   a wafer positioning system for positioning the wafer.

2. The apparatus of claim 1, further comprising an optical probe assembly below the first side of the wafer.

3. The apparatus of claim 1, wherein the supporting structure is integrated with one of a cooling system and a heating system.

4. The apparatus of claim 1, wherein the electrical probe assembly is integrated with one of a cooling system and a heating system.

5. The apparatus of claim 1, wherein the supporting structure comprises a mounting plate and the solid immersion lens is fixed in the mounting plate.

6. The apparatus of claim 1, wherein the area of a surface of at least one of the SIL and the supporting structure is less than the area of the wafer and is no less than the larger of the area of an optical collection area and an electrical probe assembly.

7. The apparatus of claim 1, wherein the surface of the SIL is uneven.

8. The apparatus of claim 1, wherein the SIL comprises one of silicon and gallium arsenide.

9. The apparatus of claim 1, wherein a portion of the wafer is mounted on a flexible module.

* * * * *